(12) United States Patent
Imai et al.

(10) Patent No.: US 8,154,675 B2
(45) Date of Patent: Apr. 10, 2012

(54) LIQUID CRYSTAL DISPLAY PANEL AND METHOD FOR MANUFACTURING THE SAME

(75) Inventors: Katsuhiro Imai, Minowa-machi (JP); Kanechika Kiyose, Matsumoto (JP); Kennosuke Kakehi, Tottori (JP); Satoshi Taguchi, Tottori (JP)

(73) Assignee: Sony Corporation, Tokyo (JP)

( * ) Notice: Subject to any disclaimer, the term of this patent is extended or adjusted under 35 U.S.C. 154(b) by 221 days.

(21) Appl. No.: 12/431,197

(22) Filed: Apr. 28, 2009

(65) Prior Publication Data

US 2009/0279009 A1    Nov. 12, 2009

(30) Foreign Application Priority Data

May 12, 2008  (JP) ................................. 2008-124351
Feb. 4, 2009   (JP) ................................. 2009-023420

(51) Int. Cl.
    *G02F 1/1333*    (2006.01)
(52) U.S. Cl. .......................................... 349/40; 349/122
(58) Field of Classification Search ........................ None
    See application file for complete search history.

(56) References Cited

U.S. PATENT DOCUMENTS

| | | | |
|---|---|---|---|
| 5,506,587 A |  | 4/1996 | Lans |
| 5,565,144 A | * | 10/1996 | Feist et al. ................. 252/520.1 |
| 5,727,057 A |  | 3/1998 | Emery |
| 5,798,732 A |  | 8/1998 | Eshenbach |
| 5,870,160 A | * | 2/1999 | Yanagawa et al. ............ 349/141 |
| 5,889,493 A |  | 3/1999 | Endo |
| 6,147,738 A | * | 11/2000 | Okamoto ....................... 349/122 |
| 6,191,837 B1 | * | 2/2001 | Fujimaki et al. .............. 349/141 |
| 6,346,932 B1 | * | 2/2002 | Maeda ............................ 345/90 |
| 6,437,797 B1 |  | 8/2002 | Ota |
| 6,646,711 B2 | * | 11/2003 | Sugano ......................... 349/187 |
| 2006/0262255 A1 | * | 11/2006 | Wang et al. .................... 349/114 |
| 2008/0099731 A1 | * | 5/2008 | Kumar et al. ................. 252/500 |

FOREIGN PATENT DOCUMENTS

| | | |
|---|---|---|
| GB | 2 321 732 | 8/1998 |
| JP | A-9-105918 | 4/1997 |
| JP | 10233985 | 9/1998 |
| JP | 10-293207 A * | 11/1998 |
| WO | WO 97/18440 | 5/1997 |
| WO | WO 98/11522 | 3/1998 |
| WO | WO 98/54896 | 12/1998 |

OTHER PUBLICATIONS

N. Kikuchi et al. Electrical and mechanical properties of $SnO_2$:Nb films for touch screens. Vacuum 66 (2002) 365-371.*
European Patent Office issued Search Report dated Feb. 24, 2011.

* cited by examiner

*Primary Examiner* — Mike Stahl
(74) *Attorney, Agent, or Firm* — K&L Gates LLP

(57) ABSTRACT

A lateral electric field liquid crystal display panel is provided which includes a pair of substrates, a liquid crystal enclosed between the pair of substrates, liquid crystal-drive electrodes provided on one of the pair of substrates, a translucent electrostatic shielding layer provided on an exterior surface of at least one of the pair of substrates, and a polarizer disposed on the translucent electrostatic shielding layer, and in this liquid crystal display panel, the translucent electrostatic shielding layer has properties not to disappear by a chemical reaction with a material forming the polarizer.

4 Claims, 11 Drawing Sheets

| | JUDGMENT OF DISAPPEARANCE | | | |
|---|---|---|---|---|
| | 100 Å | | 200 Å | |
| | UNDER POLARIZER (A) | OUTSIDE POLARIZER (B) | UNDER POLARIZER (A) | OUTSIDE POLARIZER (B) |
| TAC POLARIZER | ○ | ○ (*) | ○ | ○ |

* ALTHOUGH $SnO_2$ FILM DOES NOT DISAPPEAR, RESISTANCE INCREASES.

| | SHEET RESISTANCE (Ω/□) | | | | | |
|---|---|---|---|---|---|---|
| | 100 Å | | | 200 Å | | |
| | INITIAL VALUE | UNDER POLARIZER (A) | OUTSIDE POLARIZER (B) | INITIAL VALUE | UNDER POLARIZER (A) | OUTSIDE POLARIZER (B) |
| TAC POLARIZER | $e_1$ | $e_2$ | $e_3$ | $e'_1$ | $e'_2$ | $e'_3$ |

LIQUID CRYSTAL DISPLAY PANEL AND METHOD FOR MANUFACTURING THE SAME

BACKGROUND

1. Technical Field

The present invention relates to a lateral electric field liquid crystal display panel and a method for manufacturing the same. In more particular, the invention relates to a lateral electric field liquid crystal display panel designed so that a display image is not disturbed even when static electricity enters and to a method for manufacturing the above liquid crystal display panel.

2. Related Art

Since the thickness, the weight, and the size of a liquid crystal display panel can be advantageously reduced, the liquid crystal display panel has been widely used as display devices for various types of electronic apparatuses, such as a television, a personal computer, a mobile phone, and other mobile information terminals. This liquid crystal display panel has the structure in which a pair of substrates made of glass or the like is provided, the substrates are adhered to each other with a sealing material disposed in a non-display region between the pair of substrates so as to form a predetermined space therebetween, liquid crystal is injected in the space through a liquid crystal injection port formed at a position to which the sealing material is not applied, and the injection port is sealed after the liquid crystal is injected.

This liquid crystal display panel is formed such that first and second electrodes are provided on the above two substrates or one substrate thereof, and a predetermined voltage is applied between the electrodes so as to display various images in a display region. As this type of liquid crystal display panel, there are a display panel in which the first and the second electrodes are separately disposed on the different substrates and a predetermined voltage is applied between the electrodes, and a display panel in which the first and the second electrodes are provided on only one of the pair of electrodes and a predetermined voltage is applied between the electrodes. Among those described above, the former is called a vertical electric field liquid crystal display panel, and the latter is called a lateral electric field liquid crystal display panel.

As the vertical electric field liquid crystal display panel, for example, a twisted nematic (TN) mode, a vertical alignment (VA) mode, and a multidomain vertical alignment (MVA) mode, each having its own features, may be mentioned. In addition, as the lateral electric field liquid crystal display panel, for example, an in-plane switching (IPS) mode and a fringe field switching (FFS) mode, each having its own features as with the above, may be mentioned.

In particular, compared to the vertical electric field liquid crystal display panel, the lateral electric field liquid crystal display panel can advantageously increase a viewing angle; hence, in recent years, panels using this mode have been increasingly used. However, in the lateral electric field liquid crystal display panel, a problem in that an image is disturbed due to the influence of static electricity occurs, although this problem has not occurred in the vertical electric field liquid crystal display panel. That is, since the vertical electric field liquid crystal display panel has the structure in which electrodes are disposed on the respective first and the second substrates, and a liquid crystal layer is formed therebetween, the electrodes disposed on the substrates each have an electrostatic shielding function, and even when static electricity tries to enter from the outside, it is shielded by these electrodes, so that an image is not adversely influenced.

On the other hand, in the lateral electric field liquid crystal display panel, since the first and the second electrodes are both provided only one of a pair of the first and the second substrates and are not provided on the other substrate, the other substrate has no electrostatic shielding function. Hence, when static electricity enters from the side of the substrate which is provided with no electrodes, an image is adversely influenced.

Hence, a liquid crystal display device incorporating a lateral electric field liquid crystal display panel has been proposed in which a shielding conductive layer is provided on a substrate as an electrostatic countermeasure (for example, see JP-A-9-105918, paragraphs [0018] to [0025] and [0071], FIG. 1). With reference to FIG. 12, a liquid crystal display device disclosed in JP-A-9-105918 will be described. FIG. 12 is a cross-sectional view of an important portion of the liquid crystal display device of the related art described in JP-A-9-105918.

A liquid crystal display device 30 has a liquid crystal display panel composed of a liquid crystal layer LC provided between an upper substrate 31A and a lower substrate 31B, and a backlight unit B/L disposed at the lower substrate 31B side. The lower substrate 31B includes a polarizer 32 at an exterior surface side, and the upper substrate 31A includes a glass substrate 35A, a translucent shielding conductive layer 33, and a polarizer 34 in that order from the bottom shown in the figure.

In each pixel of the upper substrate 31A, a reference signal line and a scanning signal line are disposed parallel to each other with a relatively large space therebetween, and a plurality of reference electrodes is integrally formed with the reference signal line and is covered with an insulating film. In addition, a thin film transistor is provided on this insulating film. A color filter is formed in the lower substrate 31B. The shielding conductive layer 33 is formed of a film primarily composed of indium tin oxide (ITO), $SnO_2$, or $In_2O_3$.

According to the liquid crystal display panel disclosed in JP-A-9-105918, since the shielding conductive layer 33 is included in the upper substrate 31A located further from the backlight unit, static electricity is electrostatic-shielded by this shielding conductive layer 33, and hence, an image is prevented from being disturbed. This shielding conductive layer 33 is formed of a film primarily composed of ITO, $SnO_2$, or $In_2O_3$ However, when this shielding conductive layer 33 is formed, for example, of an ITO film among an ITO, a $SnO_2$, and an $In_2O_3$ film, the ITO film thus formed may disappear without being recognized, and as a result, the shielding effect may not be obtained in some cases. Just for reference, the ITO film has been very commonly used as a transparent conductive film forming a pixel electrode and a common electrode of a liquid crystal display panel. Accordingly, when the shielding conductive layer composed of a transparent conductive film is formed using an ITO film, various advantages, such as efficient material usage and easy handling, are obtained; hence, the ITO film is generally used for the shielding conductive layer in many cases, On the other hand, JP-A-9-105918 has disclosed that materials other than ITO are described for the shielding conductive layer; however, for example, since the above materials other than ITO are actually very difficult to be etched as compared to ITO, or the etching may not be possibly carried out in practice, it is not known whether the materials other than ITO are actually used for a pixel electrode and a common electrode and further for the shielding conductive layer.

In addition, since this shielding conductive layer 33 is provided on the glass substrate 35A, the display quality may be degraded depending on film formation ways, that is, depending on the film thickness, the transmittance, the sheer resistance, and the like. For example, pits and/or scratches may be generated on a surface of this glass substrate during its manufacturing process, and when the pits and the like are covered with the shielding conductive layer 33, the pits are liable to be easily viewed due to the relationship with the reflectance; hence, the display quality may be degraded in some cases. However, in the liquid crystal display panel disclosed in the above document, JP-A-9-105918, the problem described above has not been taken into consideration at all.

In order to develop an electrostatic countermeasure for a lateral electric field liquid crystal display panel, the inventors of the invention carried out research on the shielding effect in such a way that the shielding conductive layer is formed using an ITO film, and a polarizer is adhered to this ITO film. However, the case occurred unexpectedly in that since the ITO film formed on a substrate disappeared without being recognized, the shielding effect could not be obtained. It was understood through the investigation of this case that since the ITO film formed on the substrate was an amorphous film, this amorphous ITO disappeared by a chemical reaction with a material forming the polarizer. Hereinafter, the reason this ITO film disappeared will be further described.

In recent years, the liquid crystal display panel has been requested to have a smaller thickness in accordance with its application. This reduction in thickness has been performed through the steps of: forming a pair of substrates; applying a sealing material composed of a thermosetting resin to a non-display region of one of the above two substrates; then adhering the two substrates to each other by applying heat to the sealing material thus applied for curing thereof; decreasing the thickness of the substrates adhered to each other by mechanical polishing, chemical etching, or the like. Subsequently, an ITO film is formed as the shielding conductive layer on the surface of one of the substrates; however, since this ITO film is formed after the two substrates are adhered to each other, the ITO film cannot be formed at a temperature or more at which the thermosetting resin which forms the sealing material is adversely influenced.

That is, when the ITO film is formed at a high temperature at which the sealing material is adversely influenced, the sealing material composed, for example, of a thermosetting resin may peel off. Hence, the ITO film used as the shielding conductive layer is formed at a low temperature. However, when the ITO film is formed at a low temperature, the ITO film thus formed is an amorphous film. As a result, when a polarizer is adhered on the amorphous film in a subsequent step, because of a material component forming this polarizer, the phenomenon occurs in which the ITO film thus formed disappears.

For example, as shown in FIG. 13, the polarizer 34 of the liquid crystal display panel disclosed in JP-A-9-105918 is formed such that, protective films 34a are adhered to two sides of a polyvinyl alcohol (PVA) film 34b which is obtained by stretching a polyvinyl alcohol polymer which generally contains iodine or an organic material such as a dye in a predetermined direction. The protective film 34a is formed of tri-acetyl-cellulose (hereinafter referred to as "TAC"), a thermoplastic saturated norbornene resin, or the like. In addition, for example, under high humidity and high temperature conditions, acid components contained in the organic material, TAC, and the like, which form the polarizer, ooze out (in the figure, outline arrows) and cause a chemical reaction with the amorphous ITO formed as the shielding conductive layer 33, so that the ITO is made to disappear.

In addition, as a method for preventing ITO used as the shielding conductive layer 33 from disappearing, it may be possible that before the substrates are adhered to each other, for example, a crystallized ITO film which is not likely to chemically react with an acid component may be formed in advance instead of the amorphous film. However, when the thickness of a liquid crystal display panel is decreased, since the thickness of the substrate is generally processed by polishing or etching after two substrates are adhered to each other, even when the ITO film as described above is formed in advance, the ITO film is polished away in the step of decreasing the thickness of the substrate.

Alternatively, it is also considered that in order to suppress the ITO film from disappearing, the thickness thereof used as a shielding conductive layer is increased; however, even in the case described above, the ITO film may completely disappear in some cases. In addition, when the thickness of the ITO film used as a shielding conductive layer is increased, since the refractive index of ITO is inherently high (n=1.8 to 2), and pits (irregularity defects) and scratches are generated on the surface of the substrate in the step of decreasing the thickness thereof, the pits and the like are liable to be easily viewed, so that a new problem of degradation in display quality may arise.

Accordingly, when the shielding conductive layer is formed using ITO, an amorphous ITO film is formed because of the relationship with a panel manufacturing process, and hence a polarizer composed of a material that will not react with this amorphous ITO must be selected. As a result, the selection of the polarizer is very limited, and hence the manufacturing cannot be easily carried out. Accordingly, in consideration of the situation described above, intensive research was carried out by the inventors of the invention. As a result, it was found that when a material which did not disappear even if it was in contact with a currently commercially available polarizer was selected for a shielding conductive layer instead of ITO, and when the thickness, the sheet resistance, and the transmittance of the above material were set in respective predetermined ranges, a liquid crystal display panel which caused no degradation in display quality could be obtained; hence, the invention was finally completed.

SUMMARY

An advantage of some aspects of the invention is to provide a liquid crystal display panel in which an electrostatic shielding layer that will not disappear by a chemical reaction with a material forming a polarizer is provided to eliminate the influence of static electricity and a method for manufacturing the above liquid crystal display panel. In addition, an advantage of another aspect of the invention is to provide a liquid crystal display panel capable of making pits and scratches generated on a substrate surface difficult to be viewed as well as eliminating the influence of static electricity so as to prevent degradation in display quality and a method for manufacturing the above liquid crystal display panel.

In order to obtain the above advantages, a lateral electric field liquid crystal display panel according to a first aspect of the invention includes: a pair of substrates; a liquid crystal enclosed therebetween; liquid crystal-drive electrodes provided on one of the pair of substrates; a translucent electrostatic shielding layer provided on an exterior surface of at least one of the pair of substrates; and a polarizer disposed on the translucent electrostatic shielding layer. In the liquid crystal display panel described above, the translucent electrostatic shielding layer has properties not to disappear by a chemical reaction with a material forming the polarizer.

In the liquid crystal display panel according to the first aspect of the invention, the electrostatic shielding layer is formed of a material having properties not to disappear by a chemical react with a material forming the polarizer. Accordingly, by the liquid crystal display panel described above, even when the polarizer is adhered to the electrostatic shielding layer, it does not disappear unlike the case of a related liquid crystal display panel, and the electrostatic shielding effect can be maintained. Hence, even if the display panel receives the influence of static electricity, a display image can be prevented from being disturbed. In addition, in the liquid crystal display panel described above, since the electrostatic shielding layer does not disappear, the thickness thereof can be decreased. Hence, in the liquid crystal display panel according to the first aspect of the invention, since the reflectance decreases, even if pits and scratches are present on a substrate surface, they are difficult to be viewed, and as a result, the display quality is not degraded. Furthermore, in the liquid crystal display panel described above, since the type of polarizer provided on the electrostatic shielding layer is not particularly limited, an inexpensive polarizer including TAC may be used, and hence the liquid crystal display panel can be easily designed and manufactured.

In the liquid crystal display panel according to an embodiment of the invention, the translucent electrostatic shielding layer preferably includes a transparent conductive film or a conductive adhesive in which conductive particles are dispersed in an adhesive which is adhered to the polarizer.

The transparent conductive film can be formed by CVD or the like, and the conductive adhesive can be formed by mixing conductive particles in a general adhesive. Hence, according to the liquid crystal display panel of a preferable embodiment, the electrostatic shielding layer can be easily formed.

In the liquid crystal display panel according to an embodiment of the invention, the transparent conductive film or the conductive particles preferably primarily include $SnO_2$ or a mixture of $SnO_2$ and at least one other metal.

According to the liquid crystal display panel of a preferable embodiment, since $SnO_2$ is not likely to be dissolved by a weak acid, even when a general polarizer is used, the electrostatic shielding layer does not disappear.

In addition, in the liquid crystal display panel according to an embodiment of the invention, the mixture of $SnO_2$ and at least one other metal preferably further includes at least one of $Ta_2O_5$, $Nb_2O_5$, and $TiO_2$.

According to the liquid crystal display panel of a preferable embodiment, the resistance stabilizes, the in-plane resistance does not vary, and the resistance does not change with time.

In addition, in the liquid crystal display panel according to an embodiment of the invention, the translucent electrostatic shielding layer preferably has a thickness of 100 to 200 Å.

According to the liquid crystal display panel of a preferable embodiment, the thickness of the electrostatic shielding layer is decreased, and hence the reflectance can be decreased. That is, although the optical refractive index of the electrostatic shielding layer primarily including $SnO_2$ or a mixture of $SnO_2$ and at least one other metal is higher than that of a glass substrate, when the thickness of the electrostatic shielding layer is decreased to 100 to 200 Å, the reflectance can be decreased. Hence, when the substrate is processed by mechanical etching or chemical etching to decrease the thickness, even if pits and scratches are generated on the substrate surface, these pits and scratches can be made difficult to be viewed. Furthermore, by the use of the mixture of $SnO_2$ and at least one other metal, the resistance of the electrostatic shielding layer stabilizes, the in-plane resistance does not vary, and the resistance does not change with time.

In addition, in the liquid crystal display panel according to an embodiment of the invention, the translucent electrostatic shielding layer preferably has a sheet resistance of $9\times10^6 \Omega/\square$ or less and a transmittance of 90% or more.

According to the liquid crystal display panel of a preferable embodiment, since the sheet resistance of the electrostatic shielding layer decreases, a more effective shielding effect can be obtained. In addition, since the transmittance is increased to 90% or more, even if the electrostatic shielding layer is provided on the substrate, the brightness is hardly reduced, and the display quality of the liquid crystal display panel is not adversely influenced.

In addition, in the liquid crystal display panel according to an embodiment of the invention, it is preferable that a ground terminal be provided for one of the pair of substrates and be electrically connected to the electrostatic shielding layer.

According to the liquid crystal display panel of a preferable embodiment, since the electrostatic shielding layer can be grounded, static electricity that enters into the liquid crystal display panel can be allowed to efficiently escape outside, and as a result, the liquid crystal display panel is suppressed from malfunction caused by static electricity.

Furthermore, in accordance with a second aspect of the invention, there is provided a method for manufacturing a liquid crystal display panel which includes the steps (a) to (c). That is, the above method includes: (a) preparing a pair of substrates which are a first substrate provided with liquid crystal-drive electrodes and a second substrate disposed to face the first substrate, applying a sealing material to a non-display region of one of the pair of substrates, and adhering the pair of substrates to each other to form a space having a predetermined size inside surrounded by the sealing material; (b) forming an electrostatic shielding layer having properties not to disappear by a chemical reaction with a polarizer forming material on at least one exterior surface of one of the pair of substrates obtained in the step (a); and (c) adhering polarizers to two exterior side surfaces of the pair of substrates after the step (b).

According to the method for manufacturing a liquid crystal display panel having the steps described above, in the step (b), since the electrostatic shielding layer is formed from a material which does not disappear by a chemical reaction with the polarizer forming material, a liquid crystal display panel can be formed in which the electrostatic shielding layer does not disappear and is maintained even when the polarizer is adhered thereto.

In addition, in the method for manufacturing a liquid crystal display panel according to an embodiment of the invention, between the steps (a) and (b), the following step (d) is preferably included. The step (d) is a step of performing mechanical polishing or chemical etching on a surface of the pair of substrates obtained in the step (a) to decrease the thickness.

According to the method for manufacturing a liquid crystal display panel of a preferable embodiment, since the liquid crystal display panel whose thickness is decreased in the step (d) is obtained, a thin liquid crystal display panel in which the electrostatic shielding layer does not disappear and is maintained even when the polarizer is adhered thereto can be formed.

BRIEF DESCRIPTION OF THE DRAWINGS

The invention will be described with reference to the accompanying drawings, wherein like numbers reference like elements.

FIG. 9A is a plan view of a liquid crystal display panel illustrating the confirmation of a pit or the like.

DESCRIPTION OF EXEMPLARY EMBODIMENTS

Figure 1:
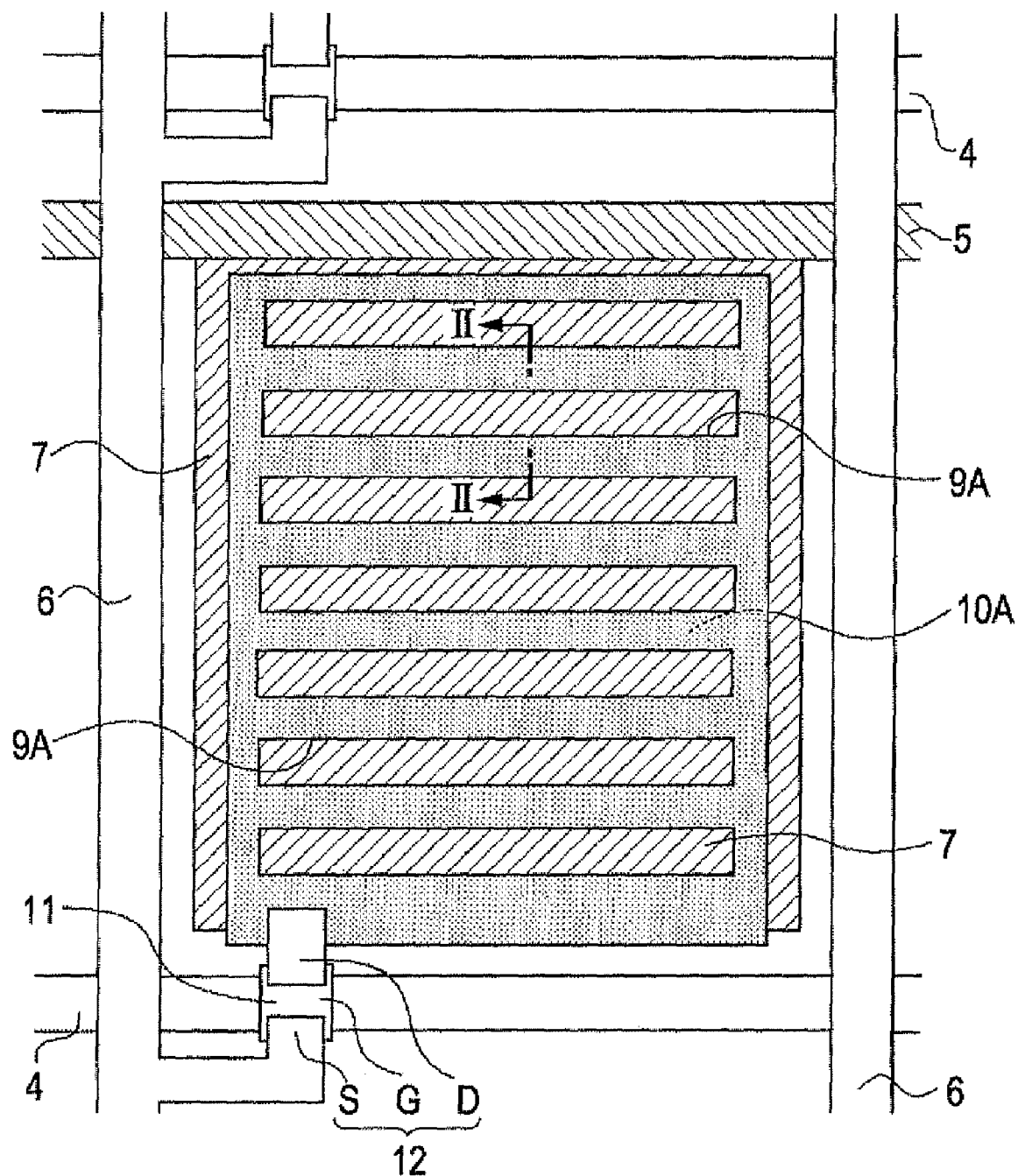
FIG. 1 is a schematic plan view of one pixel of an FFS mode liquid crystal display panel.

Hereinafter, with reference to the drawings, the best embodiments of the invention will be described. However, in the following embodiments, a liquid crystal display panel and a method for manufacturing the same, which realize the technical scope of the invention, will be described by way of example; hence, it is not intended to limit the invention to the liquid crystal display panel and the method for manufacturing the same described above, and a liquid crystal display panel and a method for manufacturing the same of another embodiment included in Claims of the invention are also included in the invention. In addition, in the drawings used for illustration, in order to recognize layers and members in the drawings, the scale reductions of the layers and the members are made different whenever necessary.

Figure 2:
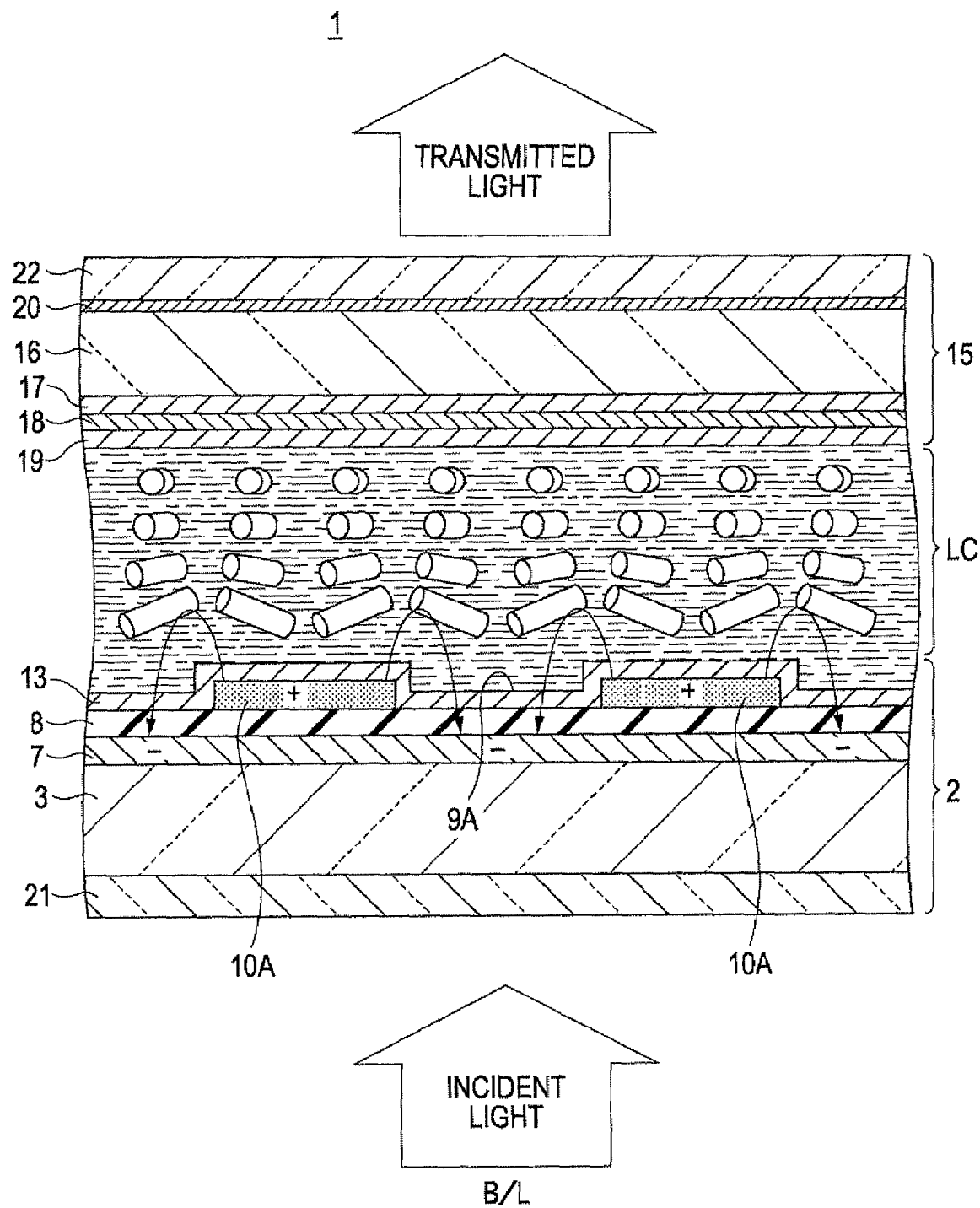
FIG. 2 is a cross-sectional view taken along the line II-II in FIG. 1.
Figure 3:
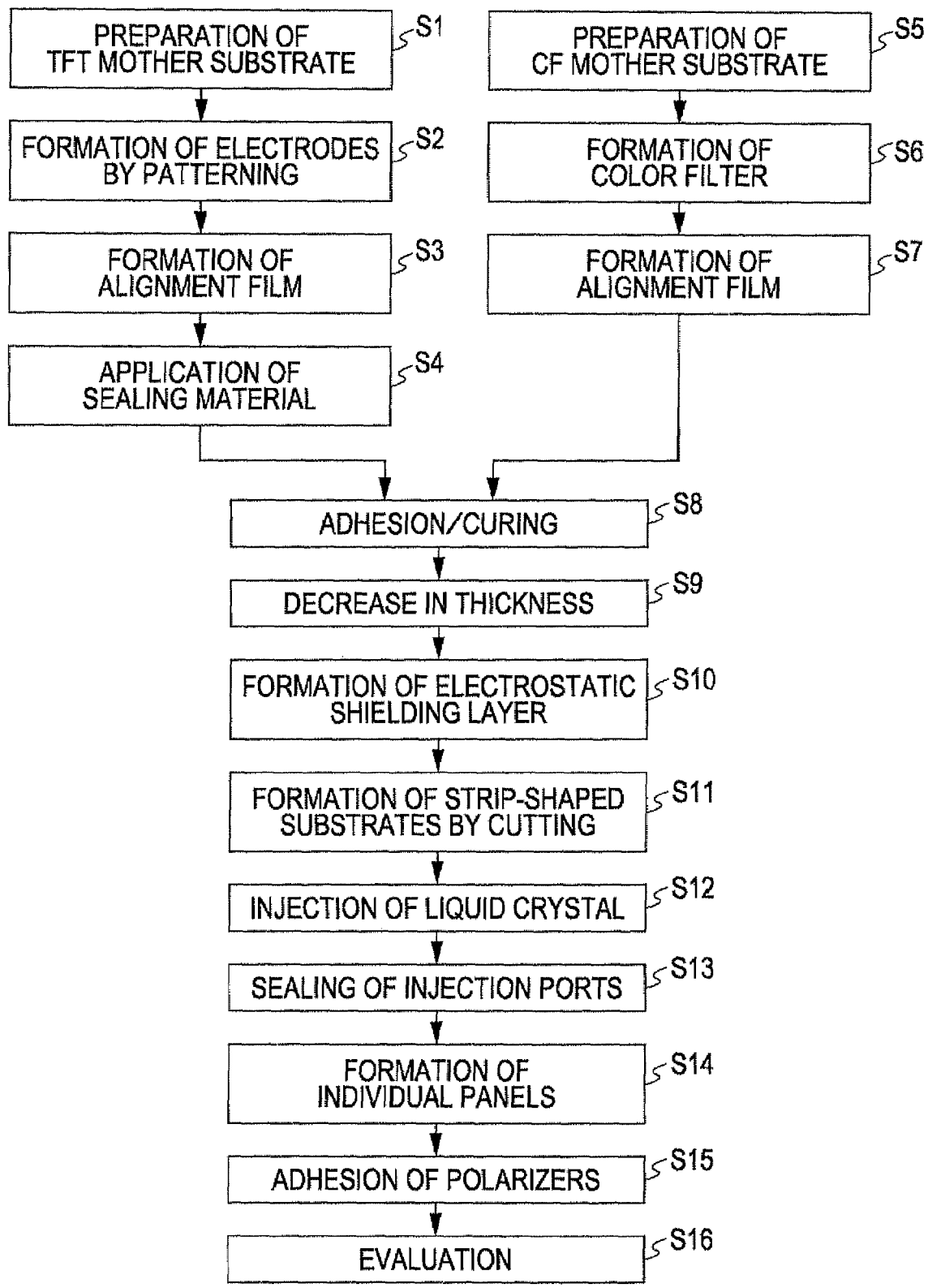
FIG. 3 is a flowchart showing manufacturing steps of a liquid crystal display panel.
Figure 4A:
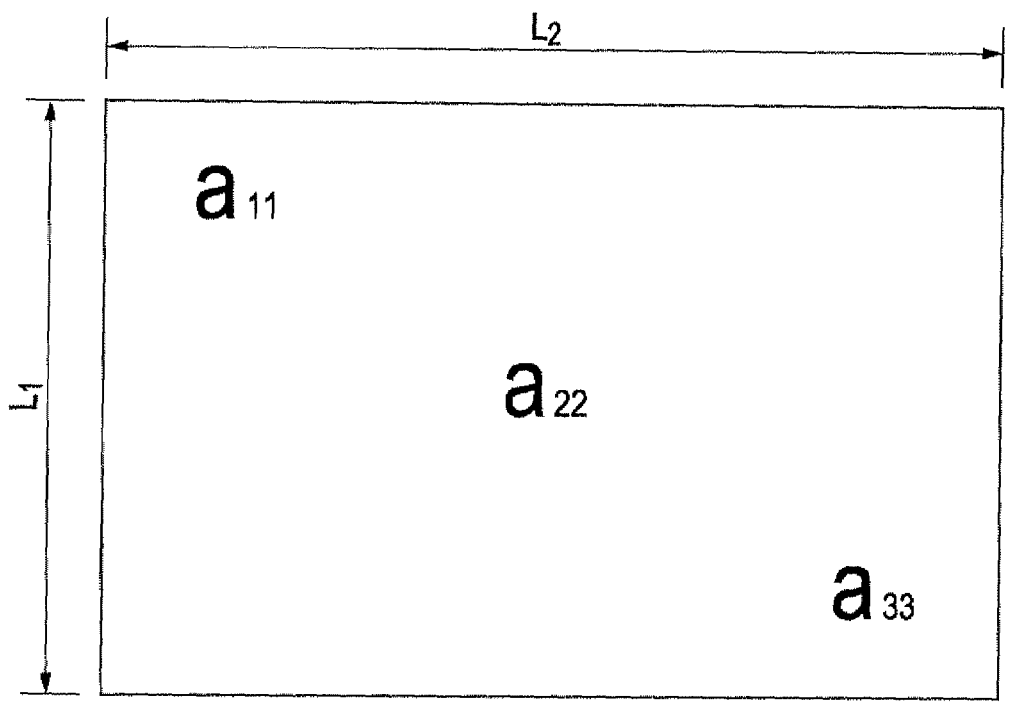
FIG. 4A is a plan view of a mother substrate on which measurement points of the thickness and measurement values thereof are shown by the same marks.
Figure 4B:
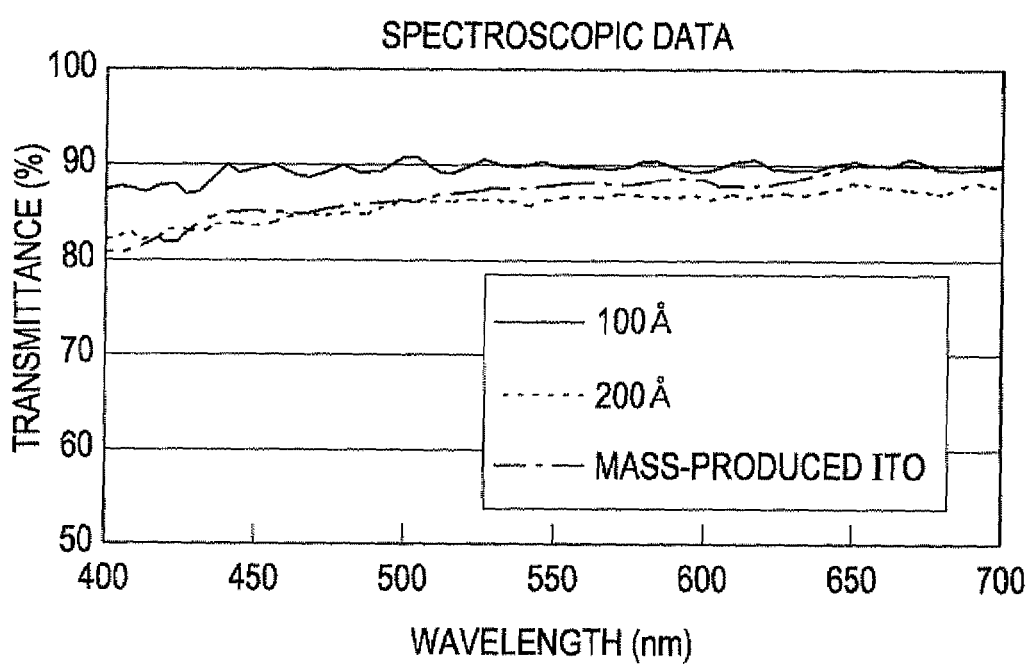
FIG. 4B is a graph showing the transmittance of a film itself.
Figure 5A:
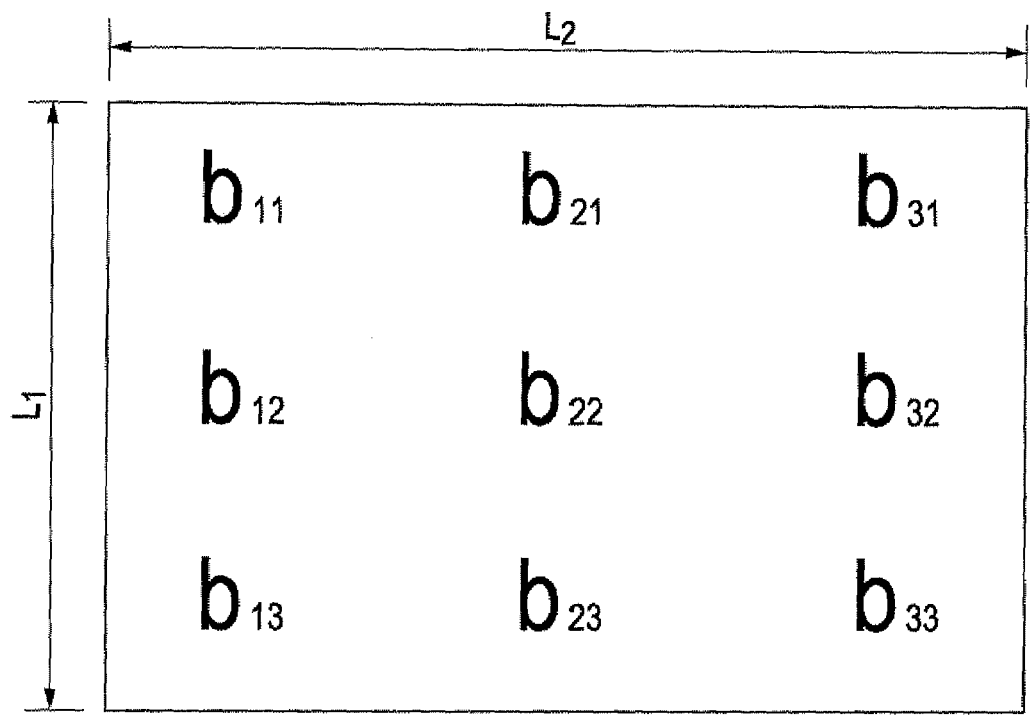
FIG. 5A is a plan view of a mother substrate for panels on which measurement points of the sheet resistance and measurement values thereof are shown which are obtained when the mother substrate is received.
Figure 5B:
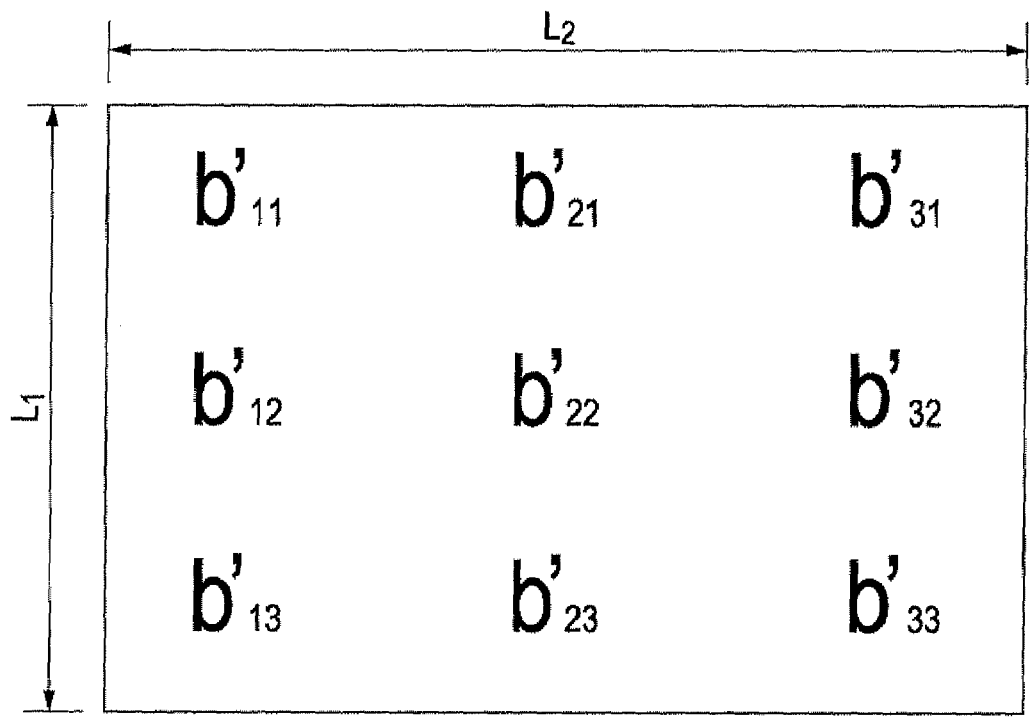
FIG. 5B is a plan view of the mother substrate on which measurement points of the sheet resistance and measurement values thereof are shown which are obtained at the stage of completing panel inspection.
Figure 6:
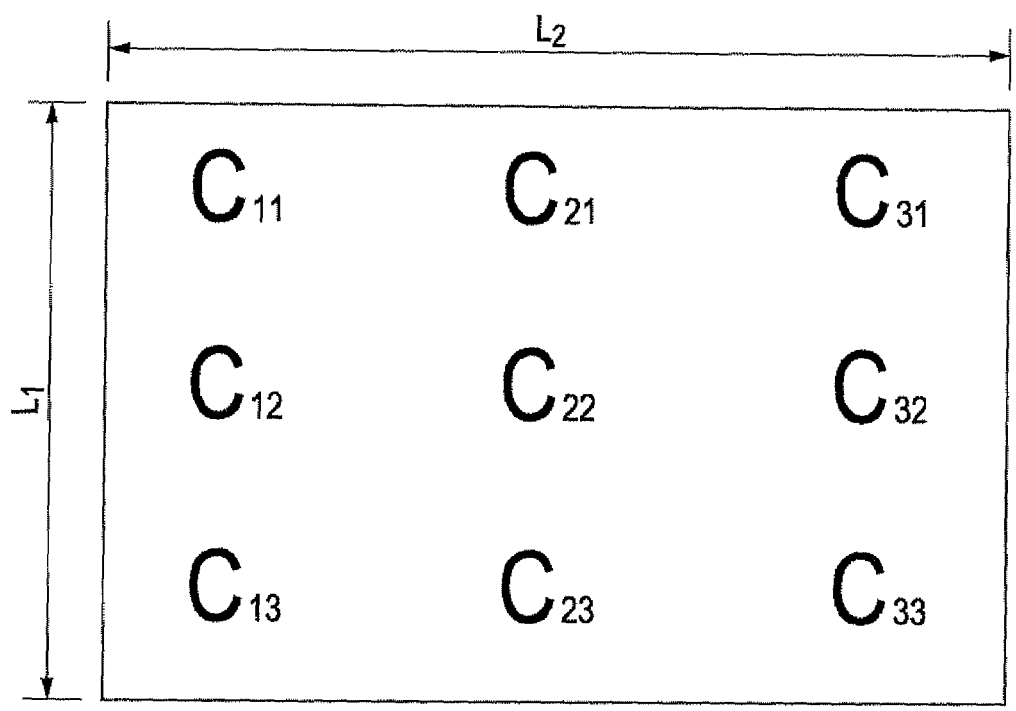
FIG. 6 is a plan view of a mother substrate on which measurement points of the adhesiveness and measurement values thereof are shown by the same marks.
Figure 7:
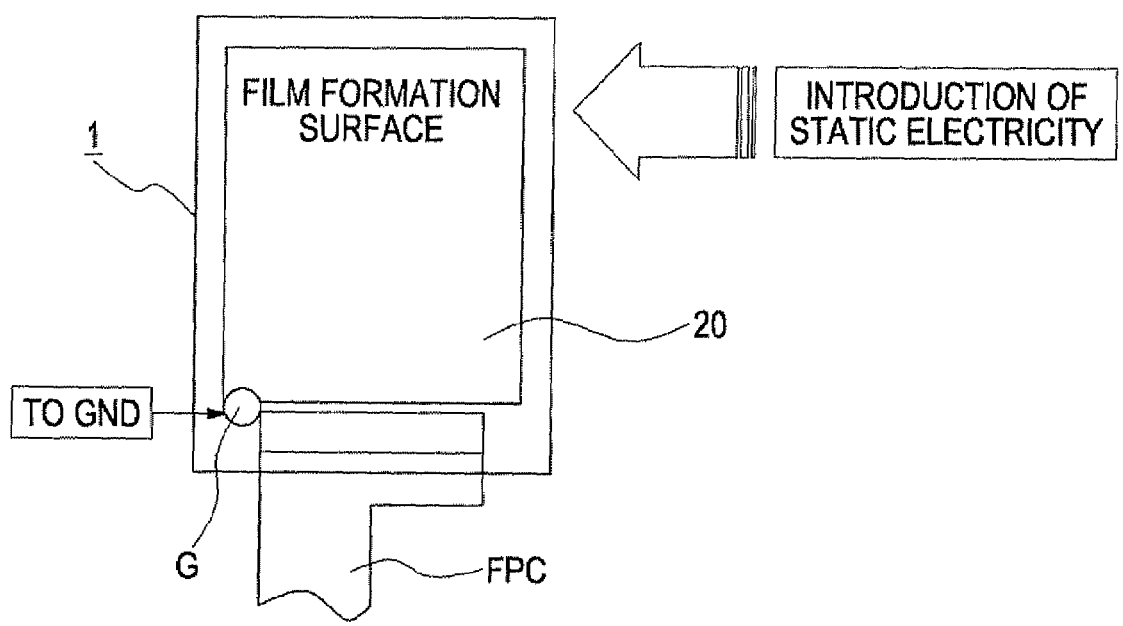
FIG. 7 is a plan view of a liquid crystal display panel illustrating an electrostatic test.
Figures 8A, 8B, 8C:
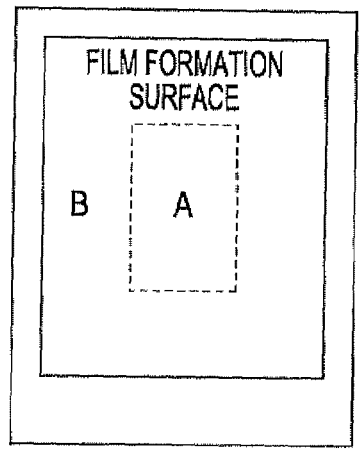
FIG. 8A is a plan view of a liquid crystal display panel illustrating a reliability test.
FIGS. 8B and 8C are views each showing the results of the reliability test.
Figure 9A:
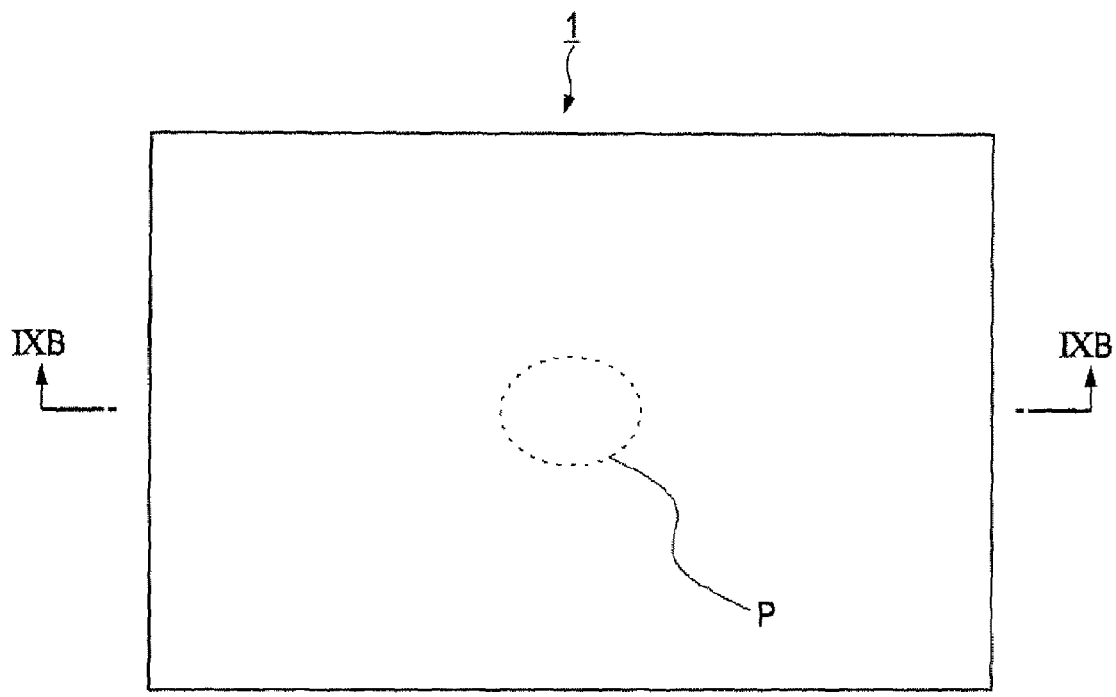
Figure 9B:
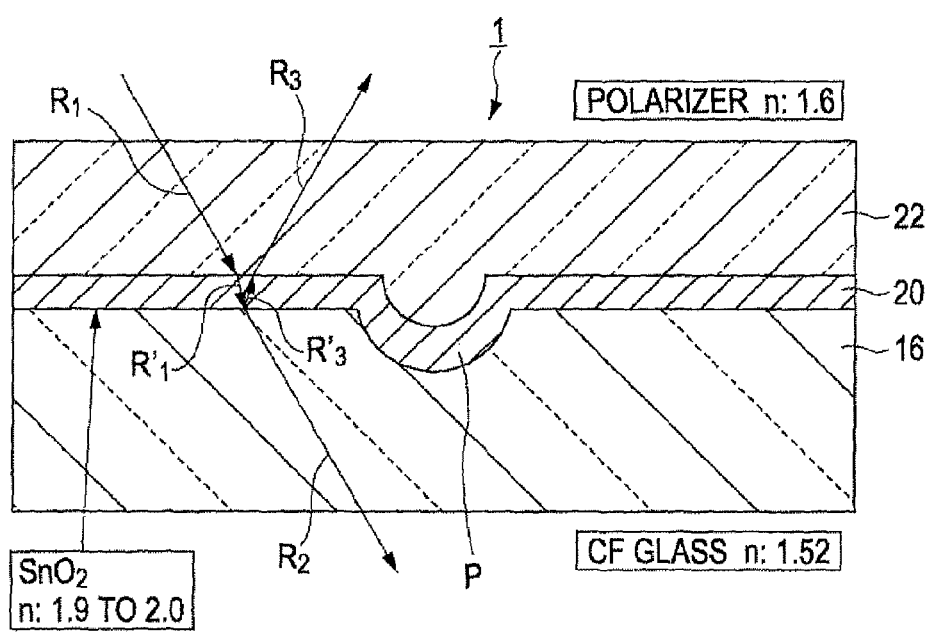
FIG. 9B is a cross-sectional view taken along the line IXB-IXB shown in FIG. 9A.
Figure 10:
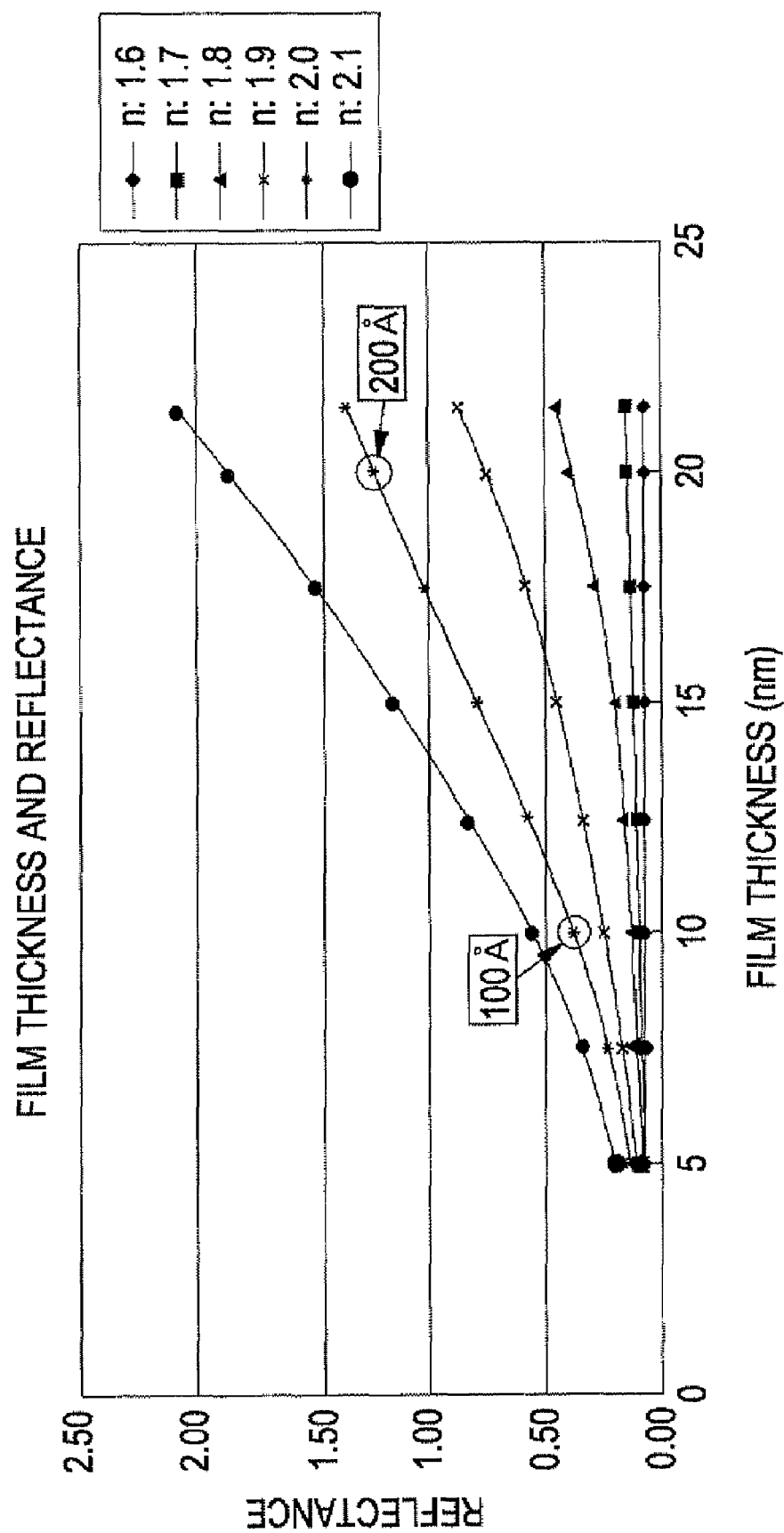
FIG. 10 is a graph showing the relationship between the thickness of a shielding conductive layer and the reflectance.

FIG. 1 is a schematic plan view of one pixel of an FFS mode liquid crystal display panel. FIG. 2 is a cross-sectional view taken along the line II-II in FIG. 1. FIG. 3 is a flowchart showing manufacturing steps of a liquid crystal display panel. FIG. 4A is a plan view of a mother substrate on which measurement points of the thickness and measurement values thereof are shown by the same marks, and FIG. 4B is a graph showing the transmittance of a film itself. FIG. 5A is a plan view of a mother substrate for liquid crystal display panels on which measurement points of the sheet resistance and measurement values thereof are shown which are obtained when the mother substrate is received, and FIG. 5B is a plan view of the mother substrate on which measurement points of the sheet resistance and measurement values thereof are shown which are obtained when inspection of the liquid crystal display panels is completed. FIG. 6 is a plan view of a mother substrate on which measurement points of the adhesiveness and measurement values thereof are shown by the same marks, FIG. 7 is a plan view of a liquid crystal display panel illustrating an electrostatic test, FIGS. 8A to 8C are views each illustrating a reliability test. FIG. 9A is a plan view of a liquid crystal display panel illustrating the confirmation of a pit or the like, and FIG. 9B is a cross-sectional view taken along the line IXB-IXB shown in FIG. 9A. FIG. 10 is a graph showing the relationship between the thickness of a shielding conductive layer and the reflectance.

Example 1

First, with reference to FIGS. 1 and 2, the structure of an FFS mode liquid crystal display panel according to one embodiment of the invention will be described. An FFS mode liquid crystal display panel 1 of this example has an array substrate 2 and a color filter substrate 15. Scanning lines 4 parallel to each other and common wires 5 parallel to each other are provided on a surface of a first transparent substrate 3 of the array substrate 2. In addition, signal lines 6 are provided in a direction orthogonally intersecting these scanning lines 4 and the common wires 5. A common electrode (also called a "counter electrode") 7 formed of a transparent material such as ITO and connected to the common wire 5 is provided so as to cover each of regions defined by the scanning lines 4 and the signal lines 6. A Pixel electrode 10A formed of a transparent material such as ITO and having strip-shaped slits 9A is provided on the surface of the common electrode 7 with a gate insulating film 8 provided therebetween. The surface of the pixel electrode 10A and that of the insulating film 8 between the slits 9A are covered with an alignment film 13.

In the vicinity of an intersection between the scanning line 4 and the signal line 6, a thin film transistor (hereinafter referred to as a "TFT") 12 functioning as a switching element is provided. In this TFT 12, a semiconductor layer 11 is disposed on a surface of the scanning line 4, the signal line 6 partly extends and covers a part of the surface of the semiconductor layer 11 to form a source electrode S of the TFT, a part of the scanning line 4 under the semiconductor layer 11 forms a gate electrode G, and in addition, a drain electrode D is formed on a part of the semiconductor layer 11 and is connected to the pixel electrode 10A.

In the color filter substrate 15, as shown in FIG. 2, a color filter layer 17 is formed on a surface of a second transparent substrate 16, and an alignment film 19 is provided on the color filter layer 17 with an overcoat layer 18 provided therebetween.

The array substrate 2 and the color filter substrate 15 thus formed are placed to face each other so that the pixel electrodes 10A and the common electrodes 7 of the array substrate 2 face the color filter layer 17 of the color filter substrate 15. Subsequently, after a sealing material is applied to a non-display region of one of the substrates, the two substrates are adhered to each other to form a predetermined space therebetween. In addition, in the above step, after a liquid crystal injection port is formed by applying no sealing material to one portion of the non-display region of the substrate, liquid crystal is injected into the space through the above injection port, and this injection port is then sealed.

Next, in the substrates 2 and 15, polarizers 21 and 22 are adhered to exterior surfaces of the first and the second transparent substrates 3 and 16, respectively. In this step, at the array substrate 2 side, the polarizer 21 is directly adhered to the first transparent substrate 3. On the other hand, at the color filter substrate 15 side, a shielding conductive layer 20 which has a predetermined resistance and thickness and which is formed of a material having properties not to disappear even if a chemical reaction occurs with a material forming the polarizer 22 is provided as an electrostatic shielding layer between the second transparent substrate 16 and the polarizer 22. This shielding conductive layer 20 is formed of a $SnO_2$ film. It was confirmed that this shielding conductive layer 20 formed of a $SnO_2$ film will not disappear even if the polarizer 22 using TAC as a protective layer is adhered thereto. This confirmation will be described later.

In addition, since the shielding conductive layer 20 does not disappear, the thickness thereof can be decreased to 300 Å or less and can be set, for example, in the range of 100 to 200 Å. When the thickness is set in the range described above, since the reflectance decreases, pits and scratches generated on the substrate are not easily viewed, and hence no degradation in display quality occurs. In addition, the sheet resistance is set to $9 \times 10^6$ ($\Omega/\square$) or less. By this setting, the shielding effect can be obtained. Furthermore, by the thickness described above, the transmittance is increased to 90% or more (at a wavelength of 550 nm). This transmittance is approximately equivalent to that obtained when ITO is used.

In this liquid crystal display panel 1, a backlight B/L is provided at the rear side of the array substrate 2. When a voltage is applied between the pixel electrode 10A and the common electrode 7, since this electric field is toward the common electrode 7 at both sides of the pixel electrode 10A, besides liquid crystal present at the slits 9A, liquid crystal present above the pixel electrode 10A can also move. Accordingly, this liquid crystal display panel 1 has a wide viewing angle and a high contrast as compared to those of other modes, such as an IPS mode liquid crystal display panel, and since further having a higher transmittance, this liquid crystal display panel can perform bright display.

In addition, according to this liquid crystal display panel 1, since an overlapped area between the pixel electrode 10A and the common electrode 7 is large when viewed from the above as compared to that of an IPS mode liquid crystal display panel, a larger storage capacity is secondarily generated, and hence no additional auxiliary capacity line is advantageously required. Furthermore, the color filter substrate 15 includes the shielding conductive layer 20, even when static electricity enters from the outside, adverse influence on a display image can be eliminated. It is preferable that a ground terminal G be provided for the substrate (see FIG. 7), and that this shielding conductive layer 20 be electrically connected to this ground terminal so as to be grounded to an external circuit. In addition, although the shielding conductive layer 20 is formed of $SnO_2$, the material is not limited thereto, and a mixture of $SnO_2$ and at least one other metal and/or oxide may also be used. For example, a mixture formed by adding at least one of tantalum oxide ($Ta_2O_5$), niobium oxide ($Nb_2O_5$), and titanium oxide ($TiO_2$) to $SnO_2$ may also be used. When the mixture as described above is used, the resistance stabilizes. In addition, this shielding conductive layer 20 may be formed of a conductive material that will not disappear due to the contact with a polarizer forming material which is to be used. Furthermore, since an adhesive is used when the polarizer is adhered, the shielding conductive layer 20 may be formed by dispersing $SnO_2$ or particles of a mixture of $SnO_2$ and at least one other metal and/or oxide in this adhesive. In addition, when particles of a mixture are dispersed in the adhesive, the particles are preferably brought into contact with each other as much as possible. Accordingly, when the density of particles is too low, the shielding conductive layer 20 may not function well in some cases, and hence the shielding conductive layer 20 is preferably formed using a transparent conductive film.

Next, with reference to FIGS. 1 to 3, a method for manufacturing the above liquid crystal display panel will be described. First, a mother substrate (hereinafter referred to as a "TFT mother substrate") for array substrates is prepared (Step S1). As this mother substrate, as shown in FIG. 4A, a rectangular glass substrate having a predetermined longitudinal width L1 (such as 680 mm) and a predetermined lateral width L2 (such as 880 mm) is used. In this TFT mother substrate, although not shown in the figure, the surface thereof is sectioned into a plurality of liquid crystal cells, and in each of the sectioned regions, as shown in FIG. 1, the scanning lines 4, the common wires 5, the TFTs 12, and the common electrodes 7 are formed.

The pixel electrodes 10A are formed on the TFT mother substrate with the gate insulating film 8 provided therebetween. These electrodes are formed by patterning (Step S2). The pixel electrodes 10A are covered with the alignment film 13 (Step S3). Subsequently, a sealing material is applied to the periphery of each non-display region except for one portion thereof (Step S4). In the portion on which the sealing material is not applied, the liquid crystal injection port is formed when the two substrates are adhered to each other. This sealing material is ejected from a nozzle by a gas pressure controlled at a predetermined value and is then applied by a dispenser type or a screen printing type device which draws a seal pattern. In addition, as the sealing material, a thermosetting resin, such as an epoxy adhesive, is used.

In addition, in Step S5, a mother substrate (hereinafter referred to as a "CF mother substrate") for color filter substrates having the same size as that of the TFT mother substrate is prepared. In this CF mother substrate, the surface thereof is sectioned into a plurality of liquid crystal cells in accordance with the sections of the TFT mother substrate, the predetermined color filter layer 17 is formed in each sectioned region, and the alignment film 19 is formed on this color filter layer 17 with the overcoat layer 18 provided therebetween (Steps S6 and S7). These mother substrates are placed to face each other with a spacer provided therebetween and are adhered to each other, and the sealing material formed of a thermosetting resin is then cured (Step S8). This adhesion is performed by applying a predetermined heat and pressure to the two mother substrates.

An exterior surface of the substrates thus adhered to each other is then processed by chemical etching or mechanical polishing so that the thickness is decreased to a predetermined value (Step S9) In this Step S9, since the substrates forming the liquid crystal display panels are processed to have a smaller thickness while the substrates are adhered to each other, a thin liquid crystal display panel in which an electrostatic shielding layer does not disappear and is maintained even if a polarizer is adhered thereto can be easily formed.

Subsequently, the shielding conductive layer 20 (electrostatic shielding layer) is formed on an exterior surface of a glass substrate (the second transparent substrate 16 shown in FIG. 2 indicates a part thereof) of the CF substrate (Step S10). This shielding conductive layer 20 is formed of a $SnO_2$ film. Since the shielding conductive layer 20 is formed of a $SnO_2$ film, as described later, even when a polarizer using TAC as a protective layer is selected and is then adhered to the $SnO_2$ film, the conductive layer does not disappear; hence, an inexpensive TAC polarizer can be used. This $SnO_2$ film is formed by sputtering, vacuum deposition, atmospheric plasma CVD, or the like. This shielding conductive layer 20 is formed to have a thickness in the range of 100 to 200 Å, and the sheet resistance and the transmittance are set to $9 \times 10^6$ (Ω/□) or less and 90% (at a wavelength of 550 nm) or more, respectively.

Hereinafter, with reference to FIGS. 4A to 6, the thickness, the transmittance, the sheet resistance, and the adhesiveness of the electrostatic shielding layer will be described.

A Formation of 100 Å- and 200 Å-Thick Films

First, a film was formed on the surface of the mother substrate in order to obtain a thickness of 100 Å, and the thickness thereof was measured. For this measurement, the thicknesses at 3 points on a diagonal line shown in FIG. 4A, that is, the thicknesses at $a_{11}$ and $a_{33}$ located at the two ends and at $a_{22}$ located at the center, were measured. As a result, as for the thicknesses at the respective points, $a_{11} > a_{22} > a_{33}$ held, and the average value was 98.0 Å. In addition, the difference between the maximum value (107 Å) and the minimum value (89 Å), that is, $(a_{11} - a_{33})$, was 18 Å.

In a manner similar to that described above, the electrostatic shielding layer was formed in order to obtain a thickness of 200 Å. As a result, the film thicknesses at the respective position satisfied the relationship represented by $a_{11} > a_{22} > a_{33}$, and the average value was 190.7 Å. In addition, the difference between the maximum value (195 Å) and the minimum value (183 Å) of the thickness of the electrostatic shielding layer, that is, $(a_{11} - a_{33})$, was 12 Å. The variation in thickness is small as described above regardless of whether the thickness is 100 Å or 200 Å, and the control of the thickness can be relatively easily performed. As for this point of view, mass productivity similar to that of ITO which has been frequently used can be obtained. However, when the control of the thickness is only considered, a larger thickness is more preferable since the variation thereof is decreased. In addition, when the variation in thickness is small, the resistance in the plane of the electrostatic shielding layer stabilizes, and the variation in transmittance and that in reflectance also decrease.

A-1 Transmittance

The transmittance of the electrostatic shielding layer itself was measured at 3 points on the diagonal line shown in FIG. 4A, that is, at $a_{11}$ and $a_{33}$ located at the two ends and at $a_{22}$ located at the center, and the results shown in FIG. 4B were obtained from the average values. In this graph, ITO (175 Å) shows the properties of a mass-produced ITO film which has been used as the electrostatic shielding layer.

From these results, when the transmittance is only considered, between the case of a thickness of 100 Å and the case of that of 200 Å, a smaller thickness was preferable, and when the thickness was 100 Å, the transmittance was higher than that of ITO. However, at a wavelength of 550 nm, the difference in transmittance between a thickness of 100 Å and that of 200 Å was approximately 1% to 2%. Hence, when the thickness was set to 175 Å, a transmittance similar to that of mass-produced ITO can be obtained. As a preferable range, the thickness is in the range of 150 to 175 Å. When the thickness is set to 100 Å or is decreased less than that, the resistance may become unstable in some cases (the resistance may vary in the plane or may change with time).

B Sheet Resistances of Electrostatic Shielding Layers Having Thicknesses of 100 Å and 200 Å

A substrate on which the electrostatic shielding layer was formed to have a thickness of 100 Å was divided into 3 sections in the longitudinal direction, and 3 points were selected in each section, so that 9 points $b_{11}$ to $b_{33}$ were determined as shown in FIG. 5A. Subsequently, the sheet resistances were measured at the above 9 points $b_{11}$ to $b_{33}$. Accordingly, the following results were obtained at the stage of receiving panels and at the stage of completing panel inspection.

B-1 Stage of Receiving Panels

The sheet resistances at the 9 points $b_{11}$ to $b_{23}$ shown in FIG. 5A had the relationship represented by $b_{12} > b_{22} > b_{23} > b_{13} > b_{32} > b_{33} > b_{21} > b_{11} > b_{31}$, and the average value 30.7 (kΩ/□). The difference between a maximum value of 54.5 (kΩ/□) and a minimum value of 16.0 (kΩ/□), that is, $(b_{12} - b_{31})$, was 38.5 (kΩ/□). As described above, as the electrostatic shielding layer, a sufficient resistance value was obtained.

B-2 Stage of Completing Panel Inspection

After steps from the above stage B-1 of receiving panels to a heat treatment (for example, in vacuum at 100° C. or in an atmosphere at 120° C.) were performed, the sheet resistances were measured at the 9 points $b'_{11}$ to $b'_{33}$ shown in FIG. 53 at the stage of completing panel inspection, the measurement results had the relationship represented by $b'_{21} > b'_{22} > b'_{12} > b'_{32} > b'_{23} > b'_{33} > b'_{11} > b'_{13} > b'_{31}$, and the average value was 31.3 (kΩ/□). The difference between a maximum value of 38.9 (kΩ/□) and a minimum value of 22.4 (kΩ/□) that is, $(b'_{21} - b'_{31})$, was 16.5 (kΩ/□). Accordingly, even at the stage of completing panel inspection, as the electrostatic shielding layer, a sufficient resistance value was also obtained.

In a manner similar to that described above, a substrate on which the electrostatic shielding layer was formed to have a thickness of 200 Å was divided into 3 sections in the longitudinal direction, and 3 points were selected in each section, so that 9 points $b_{11}$ to $b_{33}$ were determined as shown in FIG. 5A. Subsequently, the sheet resistances were measured at the above 9 points $b_{11}$ to $b_{33}$. Accordingly, the following results were obtained at the stage of receiving panels and at the stage of completing panel inspection.

B'-1 Stage of Receiving Panels

The sheet resistances at the 9 points $b_{11}$ to $b_{33}$ shown in FIG. 5A had the relationship represented by $b_{22} > b_{11} > b_{12} > b_{21} > b_{23} > b_{13} > b_{33} > b_{32} > b_{31}$, and the average value was 1.79 (kΩ/□). The difference between a maximum value of 2.44 (kΩ/□) and a minimum value of 1.17 (kΩ/□), that is, $(b_{22} - b_{31})$, was 1.27 (kΩ/□). As described above, as the electrostatic shielding layer, a sufficient resistance value was obtained.

B'-2 Stage of Completing Panel Inspection

The sheet resistances measured at the 9 points $b'_{11}$ to $b'_{33}$ shown in FIG. 5B had the relationship represented by $b'_{22} > b'_{12} > b'_{32} > b'_{13} > b'_{23} > b'_{33} > b'_{31} > b'_{11} > b'_{21}$, and the average value was 0.867 (kΩ/□). The difference between a maximum value of 1.03 (kΩ/□) and a minimum value of 0.748 (kΩ/□), that is, $(b'_{22} - b'_{21})$, was 0.282 (kΩ/□). Accordingly, even at the stage of completing panel inspection, as the electrostatic shielding layer, a sufficient resistance value was also obtained. As described above, the sheet resistance of the electrostatic shielding layer may not cause any problems regardless of whether the thickness is 100 Å or 200 Å. However, it was found that the variation in sheet resistance in the plane was smaller as the thickness was larger. In addition, when the variation in sheet resistance in the plane is smaller, it is understand that the electrostatic shielding layer is more stable against various environmental changes during a manufacturing process. Although the cases in which the thicknesses of the electrostatic shielding layer are 100 Å and 200 Å are described, as for the sheet resistance of the electrostatic shielding layer having a thickness of 175 Å at the stage of receiving panels, the average was 2.80 (kΩ/□), the maximum was 3.69 (kΩ/□), the minimum was 2.32 (kΩ/□), and the difference between the maximum and the minimum was 1.37 (kΩ/□).

C Film Adhesiveness

The adhesiveness of the electrostatic shielding layer was confirmed at 9 points, $C_{11}$ to $C_{33}$, shown in FIG. 6. As a confirmation method, rubbing may be performed using, for example, an ethanol permeated cloth, or a peeling test in accordance with JIS may be performed. Although the film peeling was inspected, no peeling could be observed at any places. As described above, after the $SnO_2$ films were formed in order to obtain thicknesses of 100 and 200 Å, the sheet resistance, the transmittance, and the adhesiveness at each thickness were evaluated, and it was confirmed that when the shielding conductive layer 20 is formed to have a thickness in the range of 100 to 200 Å, sufficient shielding effect can be obtained without degrading display qualities which includes the evaluation results described later.

In this embodiment, although the shielding conductive layer is formed using $SnO_2$, the material is not limited thereto, and a mixture of $SnO_2$ and at least one other metal and/or oxide may also be used. For example, a mixture of $SnO_2$ and at least one of tantalum oxide ($Ta_2O_5$), niobium oxide ($Nb_2O_5$), and titanium oxide ($TiO_2$) may also be used. By the use of the mixture of $SnO_2$ and at least one other metal and/or oxide as described above, the resistance can be stabilized. In addition, besides $SnO_2$, a conductive material which does not disappear due to the contact with a polarizer forming material may also be used.

Again, with reference to FIG. 3, a process from Step S11 will be described. The mother substrates adhered to each other are cut into strip-shaped substrates before individual panels are formed (Step S11). By this cutting step, liquid crystal injection ports are formed along one end side of the substrate. Liquid crystal is injected into the strip-shaped substrate obtained by cutting through the liquid crystal injection ports (Step S12). After the liquid crystal injection ports are sealed, the strip-shaped substrate is further cut to form individual panels (Steps S13 and S14). Subsequently, the polarizers 21 and 22 are adhered to each panel with an adhesive or the like, so that the panel is formed (Step S15).

Next, in Step S16, a shielding effect test, a reliability test, and confirmation of pits were performed on the liquid crystal display panel thus formed. Hereinafter, with reference to FIGS. 7 to 10 evaluation methods performed on the liquid crystal display panel and the results of the evaluation will be described.

D Shielding Effect

In this shielding effect test, two types of liquid crystal display panels were prepared in which the electrostatic shielding layers formed by the above process had thicknesses of 100 and 200 Å. After the above liquid crystal display panels were each disposed in a longitudinal direction as shown in FIG. 7, the $SnO_2$ film of each panel was connected to the ground, and static electricity was then introduced into each panel from the right side in FIG. 7. Into each panel, static electricity was introduced five times, and the shielding effect was confirmed. As a result, no abnormal display was generated on each liquid crystal display panel. Static electricity was introduced five times also into each panel during a pressure cooker test (PCT) to confirm the shielding effect, and no abnormal display was generated.

E Panel Transmittance

In addition, although transmittances of panels in which the electrostatic shielding layers had thicknesses of 100 and 200 Å were measured, the transmittances thereof were almost equal to each other. Furthermore, no difference in chromaticity was observed.

F Reliability Test

In this reliability test, whether a $SnO_2$ film disappeared or not was confirmed. For this conformation, first, as test environment conditions, the environment was prepared in which the temperature was 121° C., the humidity was 100% RH, and the pressure was 2 atmospheres. These conditions were set equal to those under which a mass-produced ITO film disappeared due to the contact with a polarizer (including TAC as a constituent).

After a polarizer including TAC as a constituent was adhered to each of panels which included electrostatic shielding layers having thicknesses of 100 and 200 Å, the evaluation was performed. In particular, after the $SnO_2$ films were held under the above conditions for 2 hours, it was confirmed by visual inspection whether the $SnO_2$ films placed at a position "A" under the polarizer and at a position "B" outside the polarizer disappeared or not. The results shown in FIG. 8B were obtained. According to the results, the $SnO_2$ films of the panels having different thicknesses did not disappear. In addition, when the resistance was measured, the results shown in FIG. 8C were obtained. That is, when the thickness of the electrostatic shielding layer was 100 Å, $e_3$ (30.0 MΩ/□)>$e_1$ (50.3 kΩ/□)>$e_2$ (16.0 kΩ/□) was obtained. In addition, when the thickness of the electrostatic shielding layer was 200 Å, $e'_1$ (1.02 kΩ/□)>$e'_3$ (0.698 kΩ/□)>$e'_2$ (0.370 kΩ/□) was obtained. From these results, it was found that when the thickness of the electrostatic shielding layer was 100 Å, the resistance at the position "B" outside the polarizer increased. When the electrostatic shielding layer is electrically connected to a ground terminal formed in the substrate, it is considered that the electrostatic shielding layer is connected to the ground terminal through a position which is not covered with the polarizer, that is, through a position outside the polarizer. In this case, an increase in resistance in a region which is not covered with the polarizer may cause a problem when connection with the ground terminal is performed. However, the resistance under the polarizer always tends to decrease. Accordingly, also from this result, it was confirmed that when the electrostatic shielding layer was formed of a $SnO_2$ film, unlike the case of an ITO film, the electrostatic shielding layer did not disappear due to the contact with a polarizer including TAC as a constituent. In addition, although the results are not described, as in the case described above, the electrostatic shielding layer did not disappear when a polarizer including a constituent other than TAC was used.

G Visual Inspection of Pits

Next, with reference to FIGS. 9A, 9B, and 10, results will be described which were obtained by the measurement whether or not a pit located at a panel center could be viewed through a polarizer when a $SnO_2$ film having a thickness of 100 or 200 Å was adhered to a panel surface. When the $SnO_2$ film is provided between the second transparent substrate 16 and the polarizer 22, since this $SnO_2$ film has a different refractive index from that of the transparent substrate 16 and the polarizer 22, a pit P having a diameter, for example, of 125 μm formed at a central portion of the substrate is likely to be viewed through the polarizer 22. That is, as shown in FIG. 9B, light $R_1$ incident from the polarizer 22 is refracted ($R'_1$) in $SnO_2$ and passes through the second transparent substrate (glass) 16 as light $R_2$, and light $R_3$ which is a part of the light $R_1$ is reflected at the $SnO_2$. Hence, light incident on the pit P is reflected diffusely at this portion, and as a result, the pit is easily viewed. As for the reflection at the pit P, since the refractive index of the second transparent substrate 16 is approximately 1.52, and the refractive index of the polarizer 22 is approximately 1.6, the refractive index of the transparent substrate 16 and that of the polarizer 22 are approximately equal to each other; hence, the reflection therebetween hardly occurs. However, since the refractive index of the $SnO_2$ film is approximately 1.9 to 2.1, the refractive index thereof is significantly different from that of the transparent substrate 16 and the polarizer 22, and hence the reflection occurs due to this difference in refractive index.

Accordingly, when the $SnO_2$ film having a different refractive index is provided between the second transparent substrate 16 and the polarizer 22, part of light incident from the second transparent substrate 16 is reflected diffusely, and when the pit P is present in the surface of the transparent substrate 16, the pit P is liable to be viewed. Hence, a countermeasure to make this pit P difficult to be viewed is required. However, the refractive index of the $SnO_2$ film cannot be changed. Accordingly, the relationship between the thickness and the reflectance was studied. As a result, the results shown in FIG. 10 were obtained. From the results shown in FIG. 10, it was found that when the thickness of the shielding conductive layer 20, that is, the thickness of the $SnO_2$ film (refractive index n: 2.0), was decreased, the reflectance decreased. When the thickness of the shielding conductive layer 20 was decreased to approximately 100 Å, the reflectance significantly decreased, and as a result, it was very difficult to view the pit P. In addition, although by visual inspection, even at a thickness of approximately 200 Å, it was practically very difficult to view the pit P. Furthermore, when the resistance of the $SnO_2$ film, the in-plane resistance variation thereof, the degree of difficulty of viewing the pit P, and the like were comprehensively taken into consideration, as the thickness of the $SnO_2$ film, it was found that a thickness of slightly larger than 100 Å was comprehensively preferable, and that a thickness in the range of approximately 150 to 175 Å was preferable.

MODIFIED EXAMPLE

Heretofore, although the invention has been described with reference to the examples, it is naturally understood that the invention is not limited to the above examples. For example, in Step S9 of the method for manufacturing a liquid crystal display panel (see FIG. 3), in the state in which the substrates are adhered to each other, an exterior surface thereof is processed by chemical etching or mechanical polishing, and the thickness of the substrate is decreased to a predetermined level. By the step described above, it is intended to easily obtain a thin liquid crystal display panel; however, the method is not limited to that described above, and a manufacturing method including no Step S9 may also be used.

For example, when the TFT mother substrate or the CF mother substrate is originally a thin substrate having a predetermined thickness, since the substrates adhered to each other has a predetermined small thickness, the exterior surface thereof is not necessarily processed by chemical etching or mechanical polishing to obtain a small thickness.

Figure 11:
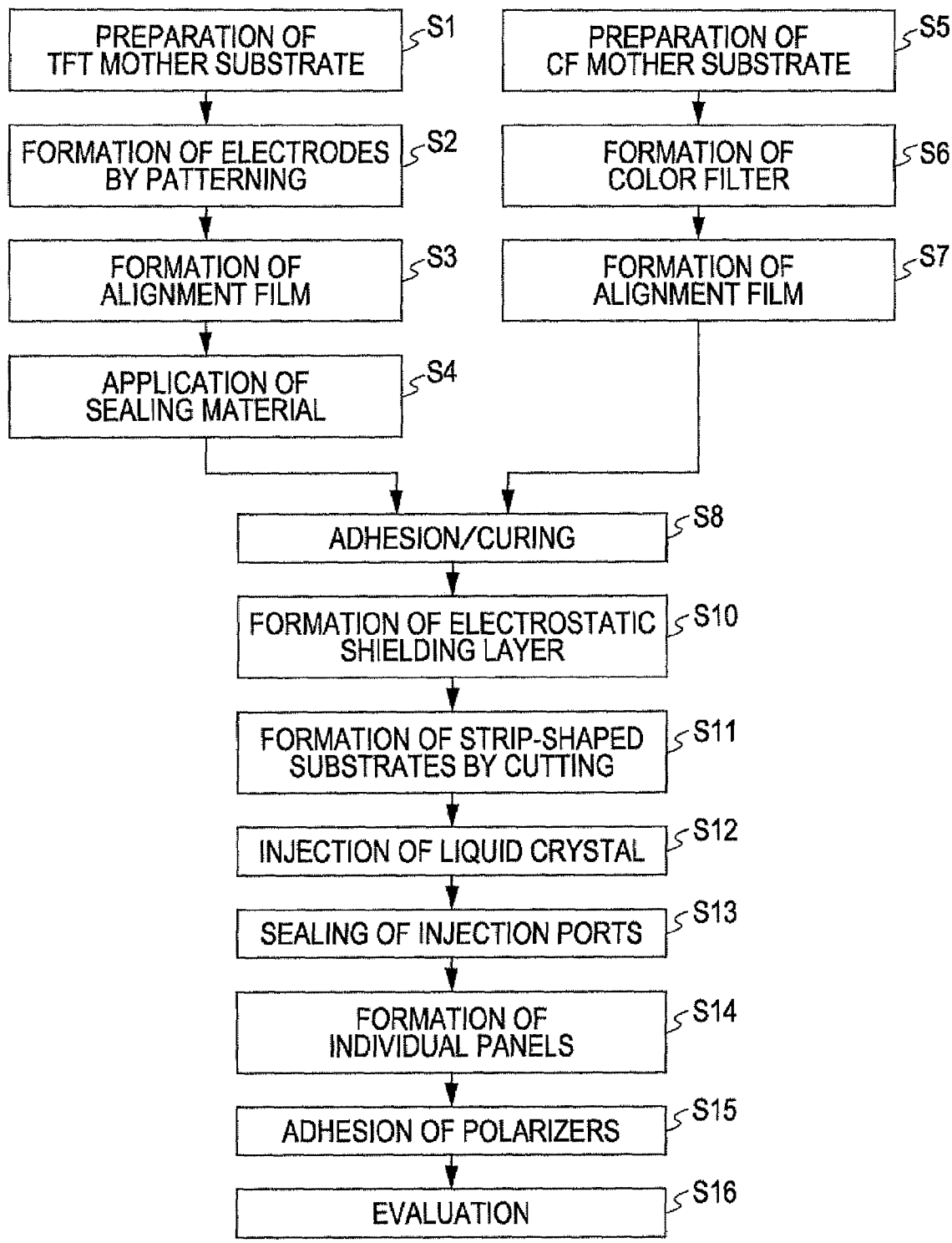
FIG. 11 is a flowchart showing manufacturing steps of a liquid crystal display panel according to a modified example.
Figure 12:
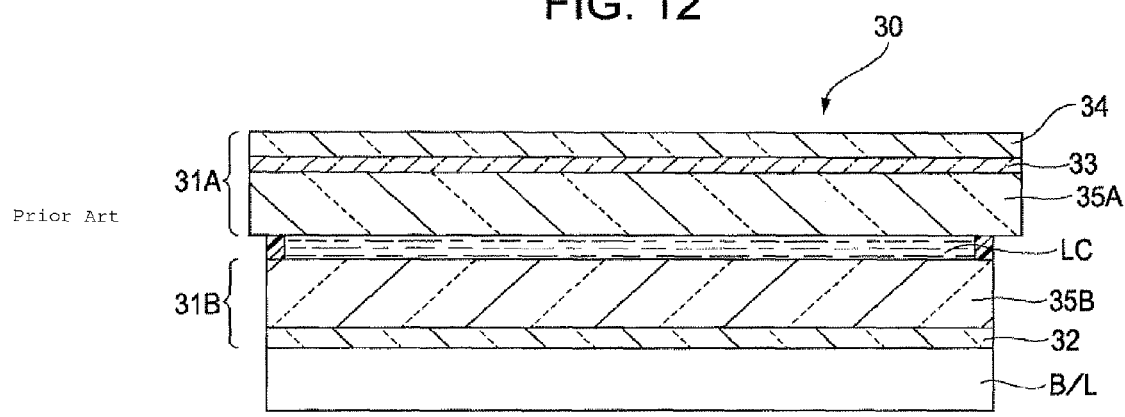
FIG. 12 is a cross-sectional view of an important portion of a related liquid crystal display device.
Figure 13:
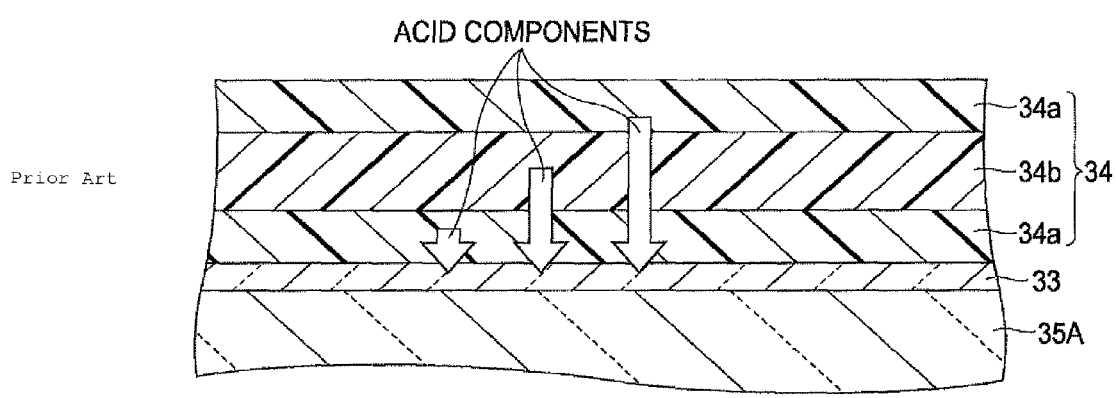
FIG. 13 is a view illustrating the structure of a polarizer of the related liquid crystal display device.

A flowchart of a method for manufacturing a liquid crystal display panel of this modified example is shown in FIG. 11. In this flow chart, the steps of this modified example shown in FIG. 11 are the same as the steps of the flowchart (see FIG. 3) of the above example except that Step S9 is not included. Hence, the same step is designated by the same reference number as that described above, and a description thereof is omitted. As shown in FIG. 11, in this modified example, the TFT mother substrate is disposed to face the CF mother substrate with a spacer provided therebetween and is then adhered to the CF mother substrate, and a sealing material made of a thermosetting resin is cured (Step S8), followed by forming the shielding conductive layer 20 on an exterior surface of a glass substrate of the CF mother substrate (Step S10).

The entire disclosure of Japanese Patent Application Nos. 2008-124351, filed May 12, 2008 and 2009-023420, Feb. 4, 2009 are expressly incorporated by reference herein.

What is claimed is:

1. A lateral electric field liquid crystal display panel comprising:
    a pair of substrates;
    a liquid crystal enclosed there between;
    liquid crystal-drive electrodes provided on one of the pair of substrates;
    a translucent electrostatic shielding layer provided on an exterior surface of at least one of the pair of substrates; and
    a polarizer disposed on the translucent electrostatic shielding layer,
    wherein the translucent electrostatic shielding layer has properties not to disappear by a chemical reaction with a material forming the polarizer,
    wherein the translucent electrostatic shielding layer has a thickness of 100 to 200 Å;
    wherein the translucent electrostatic shielding layer includes a transparent conductive film or a conductive adhesive in which conductive particles are dispersed in an adhesive which is adhered to the polarizer;
    wherein the transparent conductive film or the conductive particles primarily includes $SnO_2$ or a mixture of $SnO_2$ and at least one other metal; and
    wherein the mixture of $SnO_2$ and at least one other metal further includes at least one of $Ta_2O_5$, $Nb_2O_5$, and $TiO_2$.

2. The liquid crystal display panel according to claim 1, wherein the translucent electrostatic shielding layer has a sheet resistance of $9 \times 10^6 \Omega/\square$ or less and a transmittance of 90% or more.

3. A lateral electric field liquid crystal display panel comprising:
    a pair of substrates;
    a liquid crystal enclosed there between;
    liquid crystal-drive electrodes provided on one of the pair of substrates;
    a translucent electrostatic shielding layer provided on an exterior surface of at least one of the pair of substrates; and
    a polarizer disposed on the translucent electrostatic shielding layer,
    wherein the translucent electrostatic shielding layer has properties not to disappear by a chemical reaction with a material forming the polarizer,
    wherein the translucent electrostatic shielding layer has a thickness of 100 to 200 Å; and
    further comprising a ground terminal provided for one of the pair of substrates, wherein the ground terminal is electrically connected to the electrostatic shielding layer.

4. A lateral electric field liquid crystal display panel comprising:
    a pair of substrates;
    a liquid crystal enclosed there between;

liquid crystal-drive electrodes provided on one of the pair of substrates;
a translucent electrostatic shielding layer provided on an exterior surface of at least one of the pair of substrates; and
a polarizer disposed on the translucent electrostatic shielding layer,
wherein the translucent electrostatic shielding layer has properties not to disappear by a chemical reaction with a material forming the polarizer, and wherein the translucent electrostatic shielding layer includes a transparent conductive film or a conductive adhesive in which conductive particles are dispersed in an adhesive which is adhered to the polarizer, and the transparent conductive film or the conductive particles includes a mixture of $SnO_2$ and at least one of $Ta_2O_5$, $Nb_2O_5$, and $TiO_2$.

* * * * *